(12) United States Patent
Yu et al.

(10) Patent No.: US 7,218,524 B2
(45) Date of Patent: May 15, 2007

(54) LOCKING DEVICE FOR HEAT DISSIPATING DEVICE

(75) Inventors: Guang Yu, Shenzhen (CN); Tsung-Lung Lee, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 299 days.

(21) Appl. No.: 10/954,316

(22) Filed: Sep. 30, 2004

(65) Prior Publication Data

US 2006/0067053 A1 Mar. 30, 2006

(51) Int. Cl.
H05K 7/20 (2006.01)
H01L 23/34 (2006.01)
F28F 7/00 (2006.01)

(52) U.S. Cl. ............ 361/719; 257/719; 165/80.3; 165/185; 361/704

(58) Field of Classification Search ........ 257/718–719; 361/719–720
See application file for complete search history.

(56) References Cited

U.S. PATENT DOCUMENTS

| | | | |
|---|---|---|---|
| 5,323,845 A | 6/1994 | Kin-Shon | 165/80.3 |
| 5,771,155 A | 6/1998 | Cook | 361/710 |
| 6,101,091 A | 8/2000 | Baik | 361/704 |
| 6,282,093 B1 * | 8/2001 | Goodwin | 361/704 |
| 6,424,530 B1 | 7/2002 | Lee et al. | 631/704 |
| 6,452,803 B1 | 9/2002 | Liu | 361/704 |
| 6,568,464 B1 | 5/2003 | He et al. | 165/80.3 |
| 6,611,431 B1 * | 8/2003 | Lee et al. | 361/719 |
| 6,646,881 B1 * | 11/2003 | Lai et al. | 361/719 |
| 6,976,525 B2 * | 12/2005 | Lin | 165/80.3 |
| 2004/0012927 A1 * | 1/2004 | Lee et al. | 361/719 |

* cited by examiner

*Primary Examiner*—Greg Thompson
(74) *Attorney, Agent, or Firm*—Morris Manning & Martin LLP; Tim Tingkang Xia, Esq.

(57) ABSTRACT

A locking device for mounting a heat dissipating device to a CPU mounted on a printed circuit board, includes a back plate mounted below the circuit board and a retainer. The back plate includes a plurality of posts extending upwardly through the circuit board and engaging with screws thereat. The retainer includes a mounting section attached to the heat dissipating device and a plurality of spring locking sections extending radially from the mounting section. The locking sections are downwardly pressable to engage with the respective posts and screws whereby the retainer mounts the heat dissipating device to the electronic component.

20 Claims, 4 Drawing Sheets

US 7,218,524 B2

LOCKING DEVICE FOR HEAT DISSIPATING DEVICE

TECHNICAL FIELD

The present invention relates to a locking device, and particularly to a locking device for conveniently mounting a heat sink to an electronic component.

BACKGROUND

As computer technology continues advancing, electronic components such as central processing units (CPUs) of computers are made to provide faster operational speed and greater functional capabilities, which results in the CPUs generating a significant amount of heat. It is desirable to dissipate the generated heat quickly, for example, by using a heat sink attached to the CPU in enclosures. Generally, a locking device is required for mounting the heat sink to the CPU.

In the earlier time, a heat sink is mounted to a CPU via bolts which extends through a mounting section of the heat sink to engage with a printed circuit board on which the CPU is mounted. However, using of bolts to remove or install the heat sink is complicated and time-consuming.

Nowadays, a heat sink is often securely placed on a CPU mounted on a socket via a plate-type clamp which comprises a pressing portion crossing through and resting on the heat sink and a pair of locking legs formed at opposite ends of the pressing portion to engage with catches of the socket. Unfortunately, the plate-type clamp which generally has a great width occupies space of the heat sink which is originally desired to form more heat-dissipating fins for the heat sink. The clamp thus obviously reduces the heat dissipating surface area of the heat sink when sacrificing these desired fins and therefore decreases the heat dissipating efficiency of the heat sink. Furthermore, the plate-type clamp has a great rigidity. Thus, a large force and a tool is required to install or remove such clamps. However, the tools for installation or removal of the clamp are easy to accidentally strike the board and cause any undesired damage of the board or anything thereon. Moreover, because the deformation of the clamp is uncontrollable the contact force between the heat sink and the CPU is not capable of being adjusted to an optimized value according to the profile and weight of the heat sink to ensure the heat sink firmly and intimately contacting the CPU without damaging the CPU.

SUMMARY OF THE INVENTION

Accordingly, an object of the present invention is to provide a locking device which is capable of mounting a heat sink to an electronic device conveniently.

Another object of the present invention is to provide a locking device which is capable of providing an adjustable mounting force for a heat sink.

To achieve the above-mentioned objects, a locking device in accordance with a preferred embodiment of the present invention comprises a back plate mounted below a circuit board on which a heat dissipating device is mounted, and a retainer. The back plate comprises a plurality of posts each of which extends through the circuit board and engages with a screw at the top end thereof. The retainer comprises a mounting section attached to the heat dissipating device and a plurality of spring locking sections extending radially from the mounting section. The locking sections are downwardly pressable to engage with the respective posts and screws whereby the retainer mounts the heat dissipating device to the electronic component.

Other objects, advantages and novel features of the present invention will be drawn from the following detailed description of a preferred embodiment of the present invention with attached drawings, in which:

DETAILED DESCRIPTION OF A PREFERRED EMBODIMENT

Figure 1:
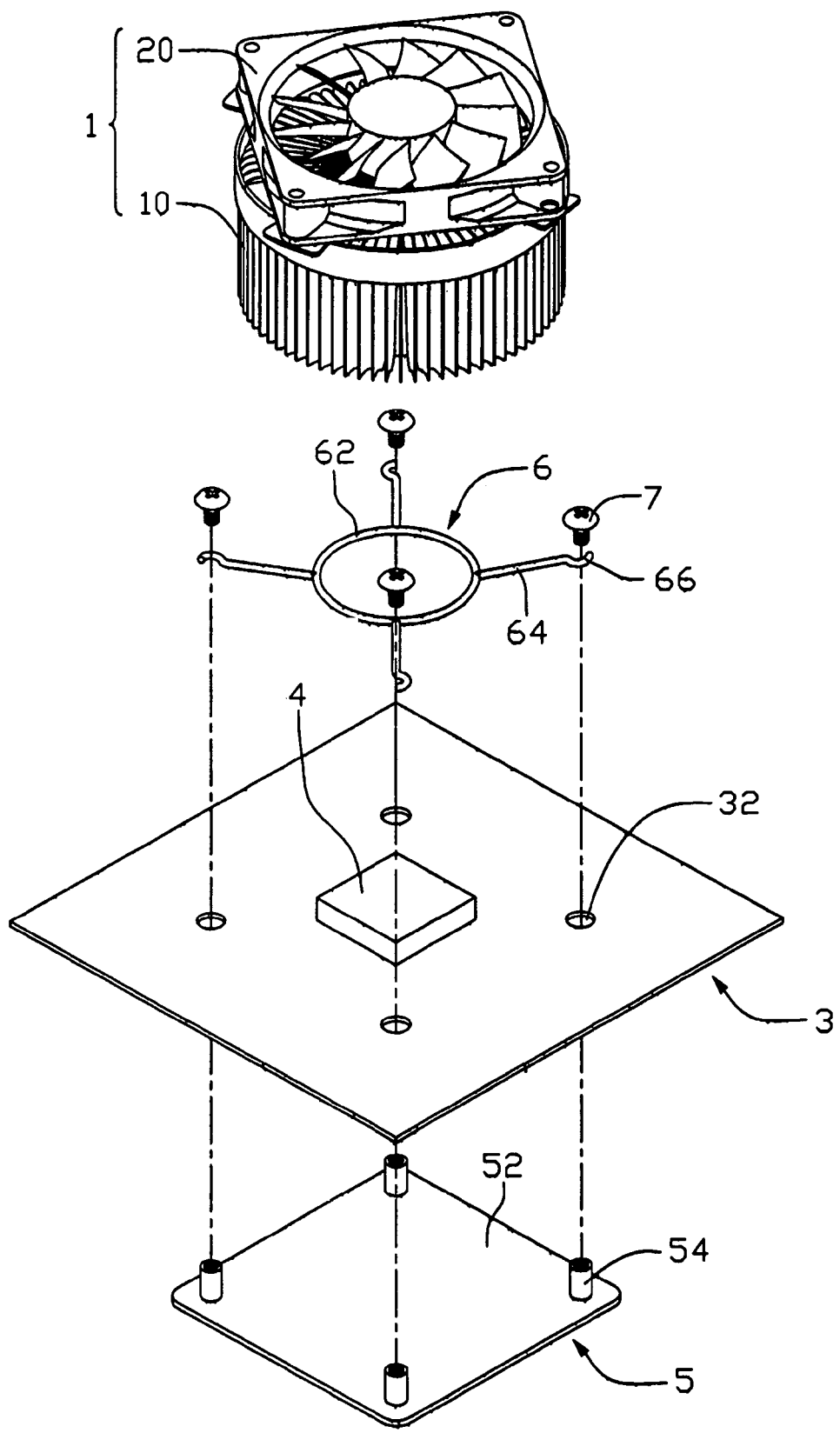
FIG. 1 is an exploded, isometric view of a locking device in accordance with a preferred embodiment of the present invention, a heat dissipating device and a printed circuit board.

FIG. 1 shows a locking device in accordance with a preferred embodiment of the present invention for mounting a heat dissipating device 1 to a printed circuit board 3 having a heat-generating electronic component 4. The heat dissipating device 1 comprises a column-shaped heat sink 10 and a fan 20 mounted on the top of the heat sink 10 for providing an enforced air flow to the heat sink 10. The printed circuit board 3 defines four through holes 32. The electronic component 4, such as a central processing unit (CPU), is installed on the printed circuit board 3 and surrounded by the through holes 32.

The locking device comprises a back plate 5 and a retainer 6. The back plate 5 comprises a body 52 and four hollow posts 54 extending upwardly and perpendicularly from corners of the body 52. Each post 54 forms a plurality of threads on the inner circumferential surface thereof for engaging with a screw 7. The combined post 54 and screw 7 act as a fastener and the total extension of the fastener is expressed by the combined post 54 and screw 7.

The retainer 6 comprises a circular-shaped mounting section 62 and four locking sections 64 extending radially from the mounting section 62. Every two adjacent locking sections 64 are perpendicular to each other. Each locking section 64 forms a semicircular-shaped hook 66 at a distal end thereof. The hooks 66 of every two adjacent locking sections 64 are mirror images with each other about a bisector between the two adjacent locking sections 64. The retainer 6 is made of a rigid wire. Alternatively, the retainer 6 is made of a plate having a good elasticity.

Figure 2:
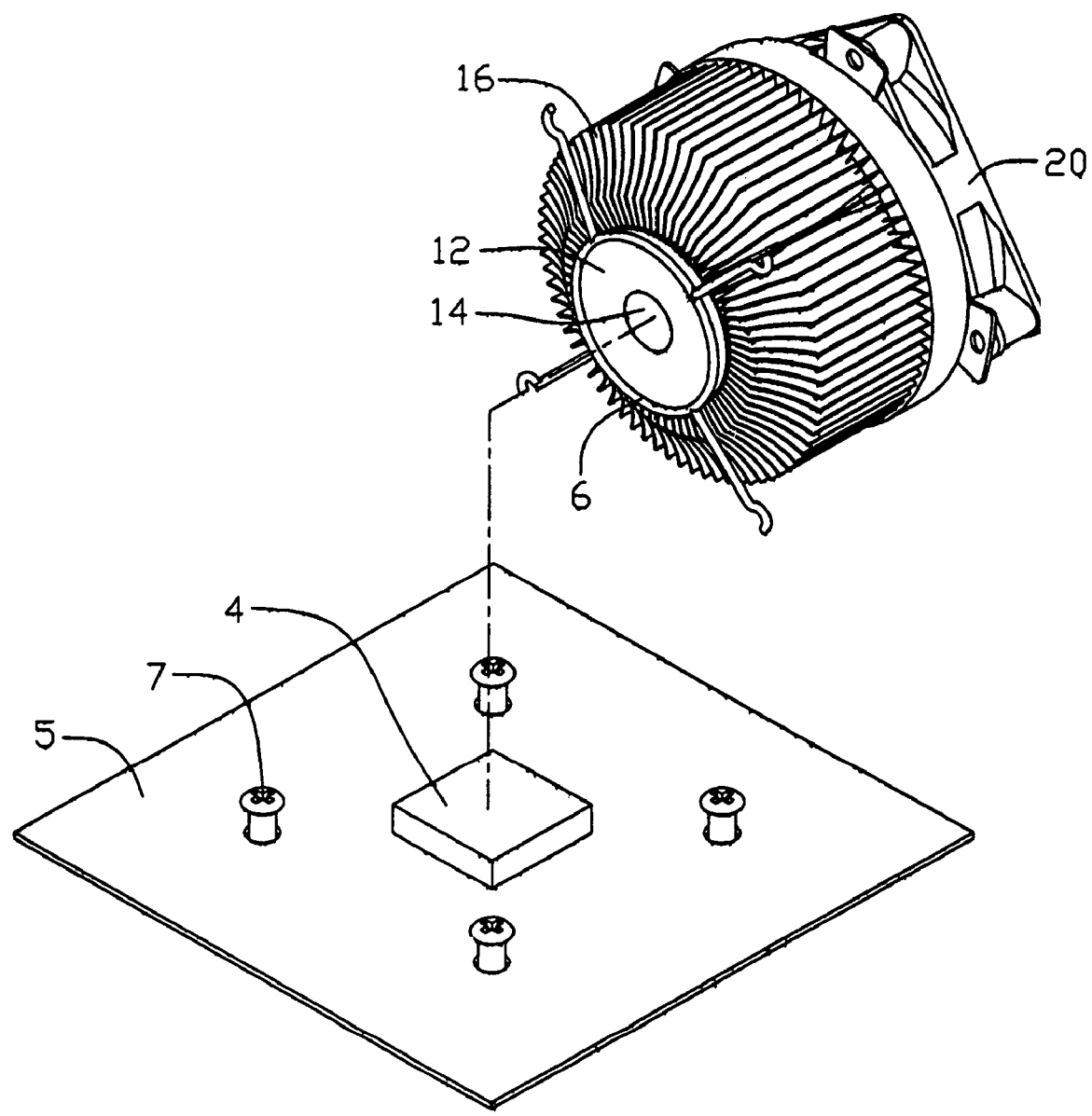
FIG. 2 is a partly assembled view of FIG. 1.

Referring to FIG. 2, the heat sink 10 comprises a hollow cone-shaped base 12, a column-shaped core 14, and a plurality of fins 16. The base 12 is made of heat conductive material, such as aluminum. A through hole is defined in the base 12 in a longitudinal direction thereof. The core 14 is made of heat conductive material, such as copper. The core 14 is fixedly received in the hole of the base 12 via soldering or other ways. The fins 16 are fixedly attached to and surround the base 12.

Figure 3:
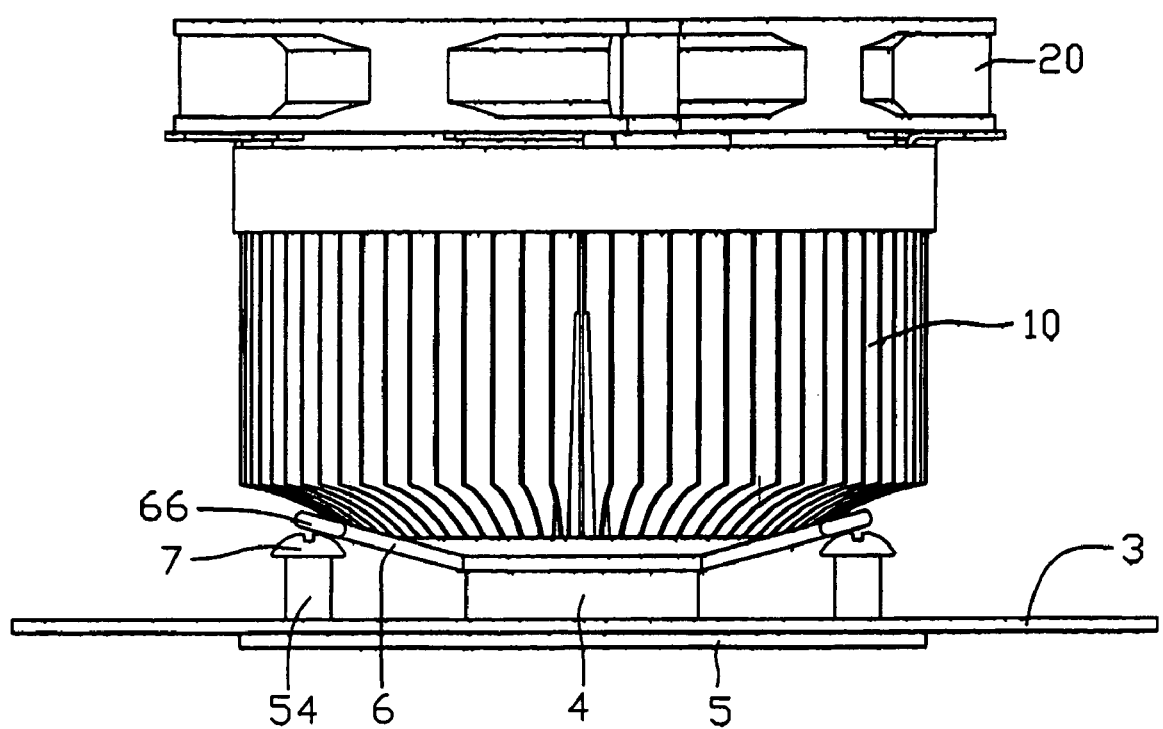
FIG. 3 is a side elevational and assembled view of FIG. 1 with the locking device at the loose position.
Figure 4:
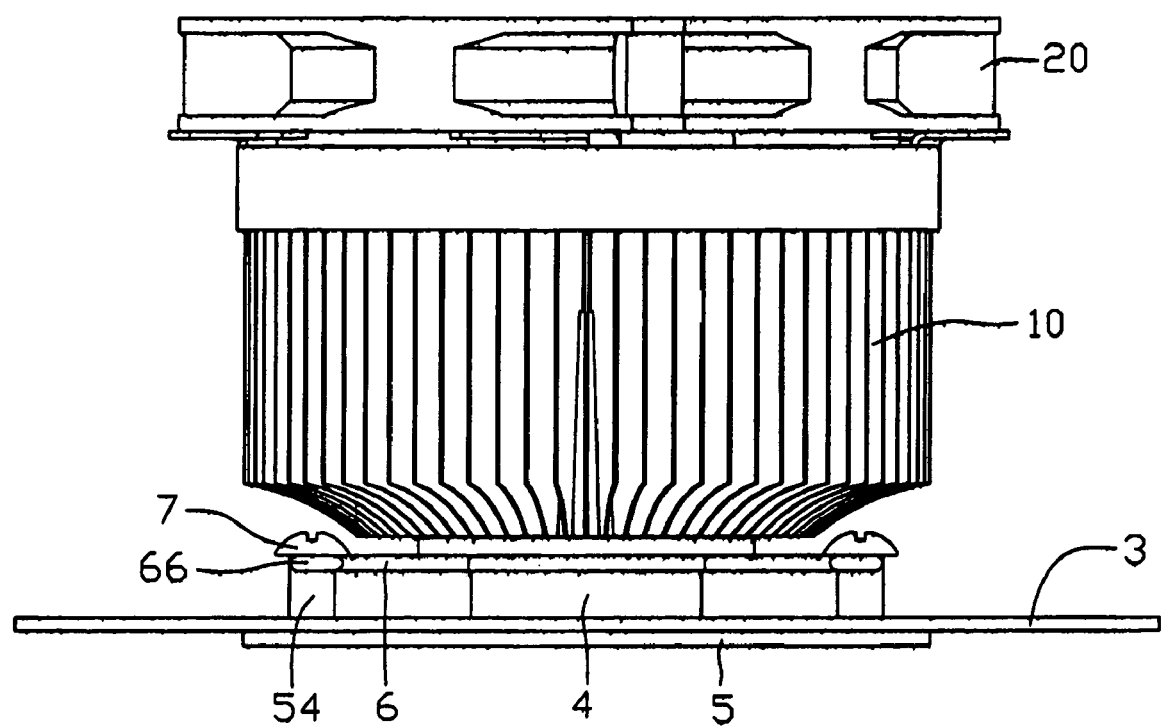
FIG. 4 is a side elevational and assembled view of FIG. 1 with the locking device at the locked position.

Referring to FIGS. 2–4, in assembly, the back plate 5 is mounted below the printed circuit board 3 with the posts 54 thereof extending through the corresponding through holes 32 of the printed circuit board 3. Screws 7 are screwed into and engaged with the corresponding posts 26. The retainer 6 is fixedly attached to the base 12 of the heat sink 10 with the mounting section 62 thereof attachably surrounding the bottom portion of the base 12. At that time, the locking sections 64 of the retainer 6 are in their original states. The heat dissipating device 1 with the retainer 6 fixed thereto is then placed on the CPU 4. The locking sections 64 of the retainer 6 are pressed downwardly until the hooks 66 thereof slide over the respective screws 7 to engage with the respective posts 54 below the screws 7. At that time, the locking sections 64 are in their compressive states. The locking sections 64 are hence elastically deformed to cause the mounting section 62 to exert downward force on the base 12 of the heat dissipating device 1 toward the CPU 4. In the similar way, the hooks 66 of the locking sections 64 exert upward force onto the screws 7 respectively which are partially screwed in the posts 54 of the back plate 5. Therefore, a contact force is generated between the base 12 of the heat sink 10 of the heat dissipating device 1 and the CPU 4, whereby the base 12 intimately contacts the CPU 4. Thus, the locking device firmly mounts the heat dissipating device 1 to the CPU 4.

In the preferred embodiment of the present invention, via changing the inserting positions of the screws 7 into the posts 54, the deformation of the locking sections 64 of the retainer 6 are adjustable to thereby adjust the contact force between the base 12 of the heat sink 10 of the heat dissipating device 1 and the CPU 4 to an optimized value according to the profile and weight of the heat dissipating device 1 to ensure the heat dissipating device 1 firmly and intimately contacting the CPU 4 without any risk of damaging the CPU 4. Furthermore, it is convenient to downwardly press the locking portions 66 of the retainer 6 to attach the heat dissipating device 1 to the CPU 4 in assembly.

It is understood that the invention may be embodied in other forms without departing from the spirit thereof. Thus, the present example and embodiment is to be considered in all respects as illustrative and not restrictive, and the invention is not to be limited to the details given herein.

What is claimed is:

1. An assembly comprising:
    a circuit board on which an electronic component and a plurality of fasteners surrounding the electronic component are provided;
    a heat dissipating device placed on the electronic component; and
    a retainer attached to the heat dissipating device and comprising a plurality of locking sections elastically deformed to engage with the fasteners respectively;
    wherein the fasteners are adjustable to adjust the deformation of the locking sections to thereby provide an adjustable contact force between the heat dissipating device and the electronic component;
    wherein the retainer is made of a wire.

2. The assembly as claimed in claim 1, wherein each of the fasteners comprises a post and a screw screwed to the post.

3. The assembly as claimed in claim 2, wherein each of the locking sections comprises a hook formed at a free end thereof and engaged between the post and the screw of a corresponding fastener.

4. The assembly as claimed in claim 3, wherein each hook has a semicircular shape and the hooks of every two adjacent locking sections are mirror image with each other about a bisector between said two adjacent locking sections.

5. The assembly as claimed in claim 2 further comprising a back plate mounted below the circuit board, the posts extending upwardly from the back plate beyond the circuit board.

6. The assembly as claimed in claim 1, wherein the heat dissipating device comprises a base and the retainer comprises a circular mounting section attachably surrounding the base.

7. The assembly as claimed in claim 6, wherein the heat dissipating device comprises a column-shaped heat sink and a fan mounted on the heat sink.

8. A combination comprising:
    a circuit board on which an electronic component and a plurality of posts surrounding the electronic component are provided;
    a heat dissipating device placed on the electronic component; and
    a retainer comprising a mounting section attached to the heat dissipating device and a plurality of elastic locking sections extending radially from the mounting section, each of the locking sections comprising a hook formed at a free end thereof;
    wherein the hooks of the locking sections are pressable to engage with the posts respectively whereby the retainer mounts the heat dissipating device to the electronic component.

9. The combination as claimed in claim 8, wherein each of the posts is provided with a screw screwed thereon and each of the locking sections is engagable with a corresponding post between said post and the screw.

10. The combination as claimed in claim 9, wherein the inserting position of the screw into said post is adjustable to adjust the deformation of the locking sections to thereby provide adjustable contact force between the heat dissipating device and the electronic component.

11. The combination as claimed in claim 10, wherein each hook engages between the post and the screw.

12. The combination as claimed in claim 11, wherein the hook is semicircular-shaped and the hooks of every two adjacent locking sections are mirror image with each other about a bisector between said two adjacent locking sections.

13. The combination as claimed in claim 10 further comprising a back plate mounted below the circuit board, the posts extending upwardly from the back plate beyond the circuit board.

14. The combination as claimed in claim 8, wherein the retainer is securely attached to the heat dissipating device prior to the locking sections being pressed to engage with the posts respectively.

15. The combination as claimed in claim 9, wherein the screws are screwed into the posts prior to the locking sections being pressed to engage with the posts respectively.

16. The combination as claimed in claim 8, wherein the heat dissipating device comprises a cone base and the retainer comprises a circular mounting section attachably surrounding the base.

17. The combination as claimed in claim 16, wherein a through hole is defined in the cone base in a longitudinal direction thereof, and the heat dissipating device further comprises a core received in the through hole of the cone base.

18. A locking device for mounting a heat dissipating device onto a heat generating component, comprising:
    a plurality of fasteners having locations of surrounding said heat generating component, each of said fasteners defining at least two engagable extensions; and a retainer attached to said heat dissipating device and having a plurality of locking sections corresponding respectively to said fasteners, each of said locking sections being engagable with one of said at least two extensions of each of said fasteners so as to provide at least two kinds of pressured contacting between said heat dissipating device and said heat generating component;

wherein the fasteners are adapted to be securely positioned in the vicinity of said heat generating component prior to said locking sections of the retainer engaging with said fasteners, respectively.

19. The locking device as claimed in claim 18, further comprising a back plate mounted beside said heat generating component opposing to said heat dissipating device, said back plate including posts extending to surround said heat generating component in order to form portions of said fasteners.

20. The locking device as claimed in claim 19, further comprising screws as the other portions of said fasteners, said at least two extensions of said fasteners being formed respectively by means of varying insertion of said screws into said posts of said back plate.

* * * * *